(12) United States Patent
Miyamoto

(10) Patent No.: US 7,063,499 B2
(45) Date of Patent: Jun. 20, 2006

(54) CONVEYOR SYSTEM

(75) Inventor: Akihiro Miyamoto, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/728,893

(22) Filed: Dec. 8, 2003

(65) Prior Publication Data
US 2004/0112715 A1    Jun. 17, 2004

(30) Foreign Application Priority Data
Dec. 9, 2002   (JP) .............................. 2002-356495

(51) Int. Cl.
  *B25J 15/00*  (2006.01)
(52) U.S. Cl. ..................... 414/744.8; 294/64.1; 901/40
(58) Field of Classification Search ............. 414/744.5, 414/744.8, 737, 752.1; 294/64.2, 64.1; 901/40
  See application file for complete search history.

(56) References Cited

U.S. PATENT DOCUMENTS

| | | | |
|---|---|---|---|
| 3,220,723 A | 11/1965 | Rabinow | |
| 4,185,814 A * | 1/1980 | Buchmann et al. | 271/108 |
| 4,566,726 A * | 1/1986 | Correnti et al. | 294/64.3 |
| 6,254,155 B1 * | 7/2001 | Kassir | 294/64.1 |

OTHER PUBLICATIONS

European Search Report and Annex dated Jan. 5, 2005.

* cited by examiner

*Primary Examiner*—Donald W. Underwood
(74) *Attorney, Agent, or Firm*—Staas & Halsey LLP

(57) ABSTRACT

A conveyor system able to safety convey a workpiece having a thickness of less than 100 μm and easily position the workpiece, provided with a plate-shaped member provided movably and swivelably and a moving and swiveling means moving and swiveling the plate-shaped member, the plate-shaped member being provided together with a lifting means for uniformly lifting in its entirety a workpiece carried at the carrying location and a holding means for holding a workpiece lifted by the lifting means by chucking its entirety on a workpiece chucking surface of the plate-shaped member, and a plurality of Verneuil nozzles serving as the lifting means and a plurality of vacuum chucking nozzles serving as the holding means being formed in the workpiece chucking surface near an outer periphery of the plate-shaped member along the outer periphery.

8 Claims, 6 Drawing Sheets

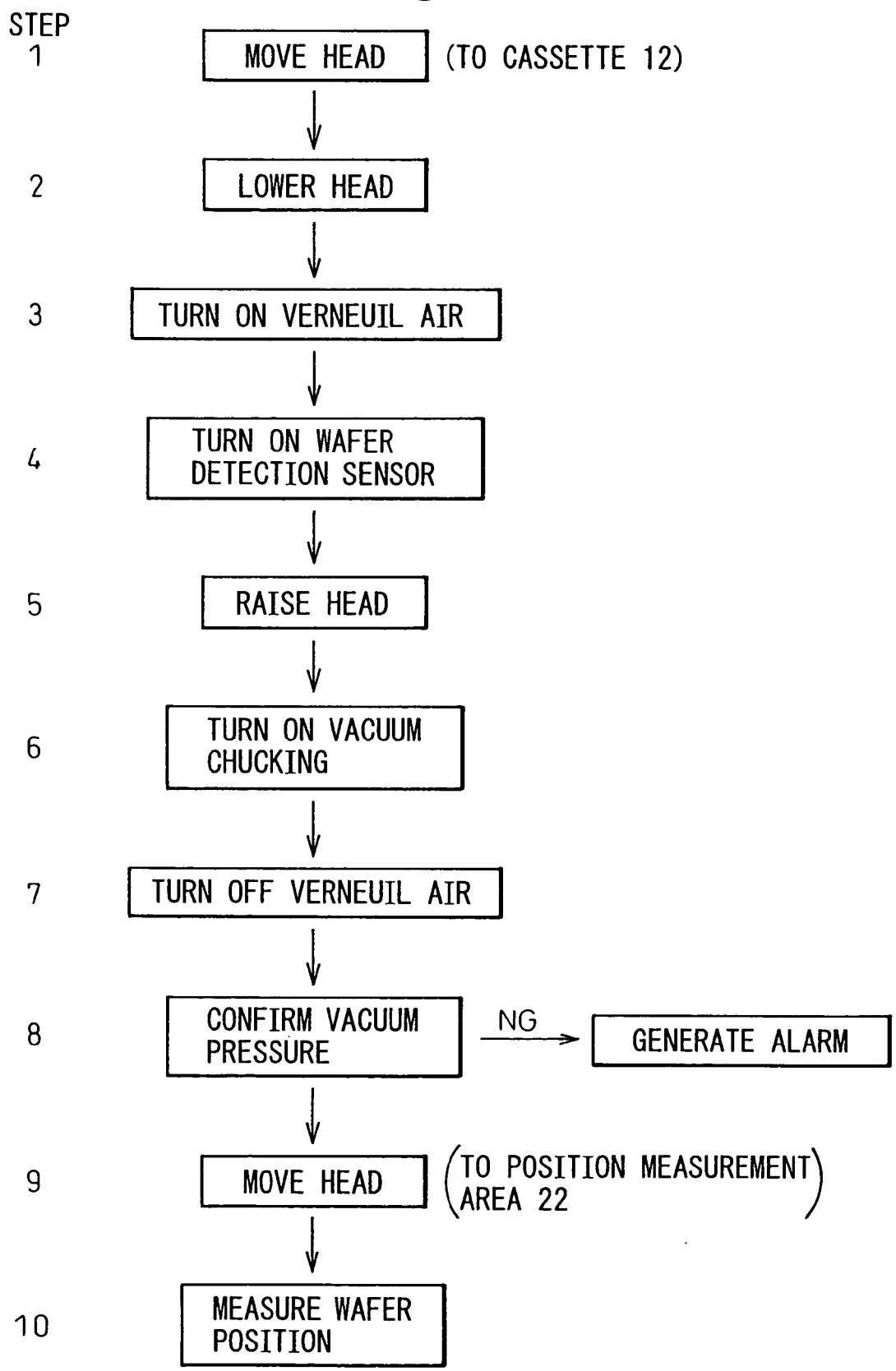

CONVEYOR SYSTEM

BACKGROUND OF THE INVENTION

1. Field of the Invention

The present invention relates to a conveyor system, more particularly relates to a conveyor system for conveying a wafer or other thin workpiece having a thickness of not more than 100 μm from a carrying location to another location.

2. Description of the Related Art

When conveying a wafer or other thin workpiece from a carrying location to another location, use can be made of a conveyor system as disclosed in for example U.S. Pat. No. 4,566,726, in particular FIG. 2A and FIG. 2B.

The conveyor system disclosed in this is shown in FIGS. 9A and 9B. The conveyor system is a conveyor system for conveying a wafer or other workpiece 100 provided with a plate-shaped member 102 at the center of one surface 102a where a Bernoulli nozzle 104 is formed. This Bernoulli nozzle 104 has a baffle plate 104a at its nozzle part and a pressurized air blowing port 104b formed in a crescent shape. Therefore, the pressurized air from the Bernoulli nozzle 104 is strongly blown out in the direction of a stopper 106 provided at the outer periphery of the plate-shaped member 102 as shown in FIG. 9B. According to this Bernoulli nozzle 104, the suction force based on the Bernoulli principle, that is, the lift, acts on the workpiece 100 and the workpiece 100 is lifted without abutting against the surface 102a of the plate-shaped member 102. However, the Bernoulli nozzle 104 blows the air out strongly in the direction of the stopper 106, so the workpiece 100 lifted by suction by the Bernoulli nozzle 104 moves in the direction of the stopper 106 and the side surface of the workpiece 100 contacts the stopper 106.

The surface 102a of the plate-shaped member 102 is provided with three vacuum chucking nozzles 108,108, and 108 near the outer periphery of the plate-shaped member 102 along the outer periphery. These vacuum chucking nozzles 108,108, and 108, as shown in FIG. 9A, are connected with a vacuum pump or other vacuum generator (not shown) through a tube 112 and conduit 110 formed in the plate-shaped member 102. The front ends of the vacuum chucking nozzles 108,108, and 108, as shown in FIG. 9A, are provided projecting out from the surface 102a of the plate-shaped member 102. Therefore, the workpiece 100 lifted by the Bernoulli nozzle 104 and abutting against the stopper 106 is chucked to the front ends of the vacuum chucking nozzles 108,108, and 108 without abutting against the surface 102a of the plate-shaped member 102.

According to the conveyor system shown in FIGS. 9A and 9B, the workpiece 100 lifted in a noncontact state with the surface 102a of the plate-shaped member 102 by the Bernoulli nozzle 104 is chucked near the periphery to the front ends of the vacuum chucking nozzles 108,108, and 108, so it is possible to convey the workpiece 100 in a substantially noncontact state with the plate-shaped member 102. Further, the workpiece 100 chucked to the front ends of the vacuum chucking nozzles 108,108, and 108 are in a fixed state with the plate-shaped member 102, 50 by swiveling the plate-shaped member 102, it is possible to easily position the work 100. In recent years, however, the wafers used for semiconductor chips have been made thinner. Wafers of thicknesses of less than 100 μm are being provided to the market. If conveying such thin wafers using the conveyor system shown in FIGS. 9A and 98, it is learned that the wafers will easily fracture or other problems will occur during conveyance.

SUMMARY OF THE INVENTION

An object of the present invention is to provide a conveyor system enabling safe conveyance and easy positioning of a workpiece without damaging a thin workpiece of a thickness of less than 100 μm.

The inventors studied how to achieve this object and as a result discovered that by using a movable plate-shaped member formed with a plurality of Bernoulli nozzles and a plurality of vacuum chucking nozzles alternately at the workpiece chucking surface near the outer periphery of the plate-shaped member along the outer periphery, it is possible to safely convey a thin workpiece having a thickness of less than 100 μm and easily position the workpiece without damaging it and thereby perfected the present invention.

According to a first aspect of the present invention, there is provided a conveyor system for conveying a wafer or other thin workpiece having a thickness of not more than 100 μm from a carrying location to another location, wherein the conveyor system is provided with a plate-shaped member provided movably and swivelably and a moving and swiveling means moving and swiveling the plate-shaped member, the plate-shaped member is provided together with a lifting means for uniformly lifting in its entirety a workpiece carried at the carrying location and a holding means for holding a workpiece lifted by the lifting means by uniformly chucking its entirety on a workpiece chucking surface of the plate-shaped member, and a plurality of Bernoulli nozzles serving as the lifting means are formed in the workpiece chucking surface near an outer periphery of the plate-shaped member along the outer periphery.

By comprising the holding means by a plurality of vacuum chucking nozzles and by alternately forming the plurality of Bernoulli nozzles forming the lifting means and the plurality of vacuum chucking nozzles on the workpiece chucking surface near the outer periphery of the plate-shaped member along the outer periphery, it is possible to simplify the structure of the plate-shaped member. By using a porous member for a chucking pad of a vacuum chucking nozzle, it is possible to eliminate the danger of making chucking marks on the workpiece. Further, by comprising the holding means by at least one electrostatic chucking plate and providing the electrostatic chucking plate at the workpiece chucking surface of the plate-shaped member, it is possible to further simplify the structure of the plate-shaped member for an electrostatically chuckable workpiece. In the present invention, since a lifting means and a holding means are both used, by providing a controller for controlling a drive timing of the two, it is possible to accurately drive and stop the two means at predetermined timings and possible to reliably convey the workpieces. Further, by providing a detachment prevention member for preventing part of the workpiece lifted by the plurality of Bernoulli nozzles from being detached from the plate-shaped member at the outer periphery of the plate-shaped member, it is possible to reliably position the workpiece at one surface of the plate-shaped member. By biasing the detachment prevention member by an elastic member in a direction where its front end projects out from the workpiece chucking surface of the plate-shaped member, it is possible to easily change the length of the detachment prevention member projecting out from the workpiece chucking surface of the plate-shaped member by adjusting the biasing force of the elastic member etc. Further, by providing a switching station provided with a plurality of pressurized air blowing nozzles blowing pressurized air from below the workpiece so as to prevent the workpiece from dropping off when switching a workpiece lifted by the lifting means comprised of a plurality of Bernoulli nozzles to holding by the holding means, it is possible to reliably prevent a situation where the workpiece drops off and is damaged when switching from the lifting means to the holding means.

According to the present invention, it is possible to equally lift a workpiece having a thickness of less than 100 μm carried at the carrying location without the workpiece as a whole abutting against the workpiece chucking surface of the plate-shaped member by a plurality of Bernoulli nozzles formed in the workpiece chucking surface near the outer periphery of the plate-shaped member along the outer periphery. Further, the lifted workpiece is held by chucking to the workpiece chucking surface of the plate-shaped member equally as a whole by a holding means provided at the plate-shaped member. In this way, it is possible to easily recognize the position of a workpiece chucked to the workpiece chucking surface of the plate-shaped member and possible to position the workpiece by moving and/or swiveling the plate-shaped member by a moving and swiveling means based on this recognition.

According to a second aspect of the present invention, there is provided a conveyance method using any of the above conveyor systems including the steps of moving the plate-shaped member to a first position on which a workpiece is placed, lowering the plate-shaped member down to the workpiece, starting the blowing of air from the Bernoulli nozzles, chucking the workpiece by the Bernoulli nozzles, lifting up the plate-shaped member, starting suction by vacuum chucking nozzles to chuck the workpiece by both of the vacuum chucking nozzles and Bernoulli nozzles, stopping the blowing of air from the Bernoulli nozzles and chucking the workpiece by only the vacuum chucking nozzles, and moving the plate-shaped member to a second position for processing of the next workpiece.

BRIEF DESCRIPTION OF THE DRAWINGS

These and other objects and features of the present invention will become clearer from the following description of the preferred embodiments given with reference to the attached drawings, wherein:

FIG. 8 is a flow chart of an example of a process for conveying a wafer using the conveyor system of FIG. 1.

DESCRIPTION OF THE PREFERRED EMBODIMENTS

Preferred embodiments of the present invention will be described in detail below while referring to the attached figures.

Figure 1:
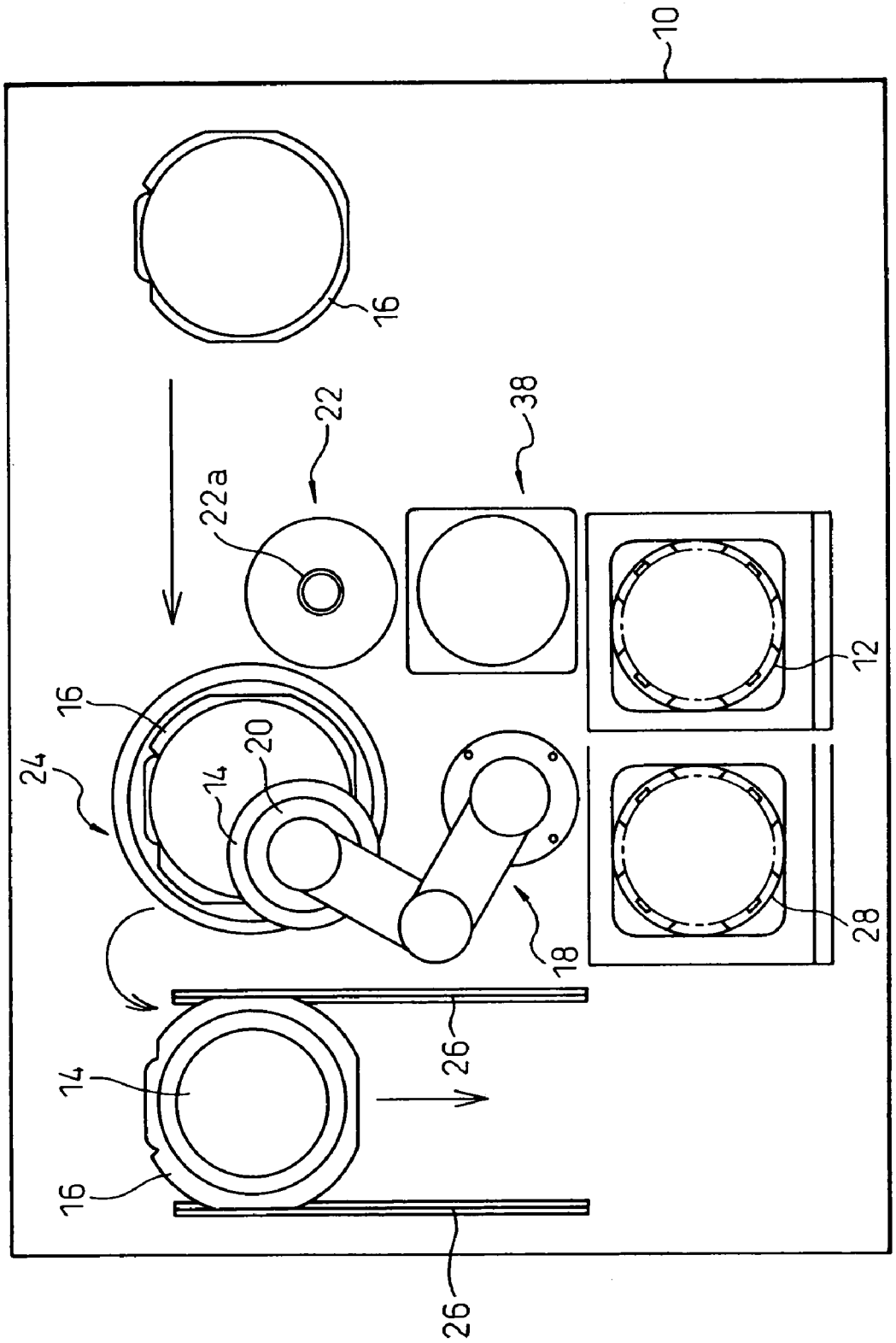
FIG. 1 is a schematic view for explaining an example of a conveyor system according to the present invention.

FIG. 1 shows a conveyor system taking out from a cassette 12 placed at a carrying position of a base 10 a silicon wafer 14 having a thickness of less than 100 μm as one of a plurality of workpieces stacked via interlayer paper (hereinafter referred to simply as a "wafer 14" in some cases) in the cassette 12, positioning it, and adhering it to an adhesive ring 16. In the conveyor system shown in FIG. 1, a multiarticulated robot 18 is placed on the base 10. Around this, a position measurement area 22 on which a camera 22a is provided, an adhesion area 24 for adhering a wafer 14 positioned by the tape adhered to the adhesive ring 16, and rails 26, 26 for sending to the next step the adhesive ring 16 on which a wafer 14 is attached by the tape.

The front end head of the multiarticulated robot 18 has the plate-shaped member 20 attached swivelably to it. This plate-shaped member 20 takes out one wafer 14 among the plurality of wafers 14, 14 . . . stacked in the cassette 12. The wafer 14 taken out by the plate-shaped member 20 is moved to the position measurement area 22 by movement of the plate-shaped member 20 by the multiarticulated robot 18. In this position measurement area 22, the position of the taken out wafer 14 is recognized. Next, the plate-shaped member 20 is moved on the adhesion area 24 by the multiarticulated robot 18, the plate-shaped member 20 is swiveled to position the wafer 14 based on the positional data of the wafer 14 recognized by the position measurement area 22, then the wafer 14 is placed on and adhered to the tape of the adhesive ring 16. Next, the adhesive ring 16 comprised of the tape with the wafer 14 adhered to it is turned upside down, placed on the reels 26, 26, and conveyed to the next step. In this conveyor system, the interlayer paper sandwiched between the wafers 14, 14 . . . in the cassette 12 is conveyed to a container 28 placed on the base 10 adjoining the cassette 12.

Figure 2A:
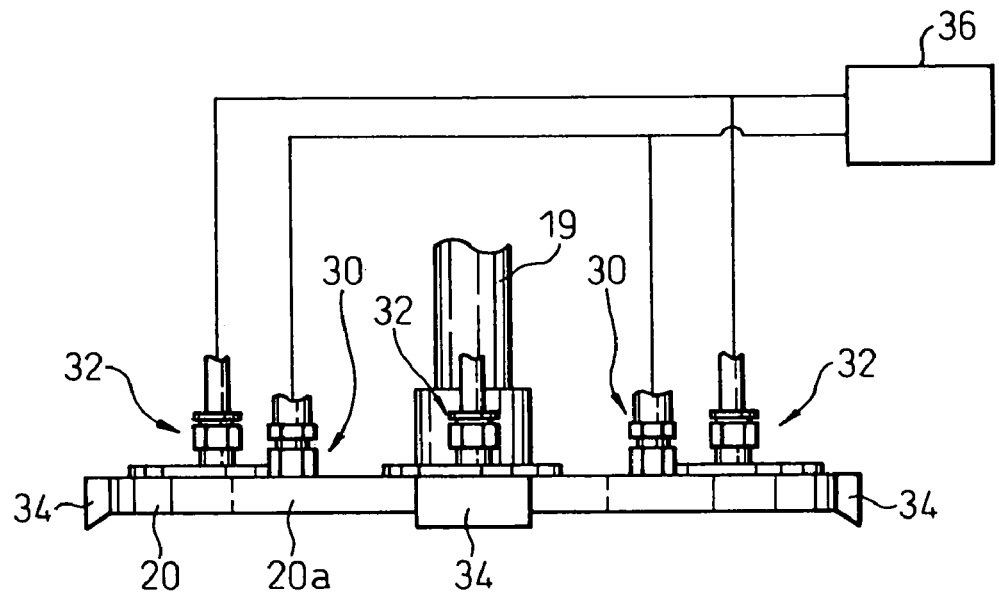
FIGS. 2A and 2B are a front view and a bottom view for explaining a plate-shaped member used in FIG. 1.
Figure 2B:
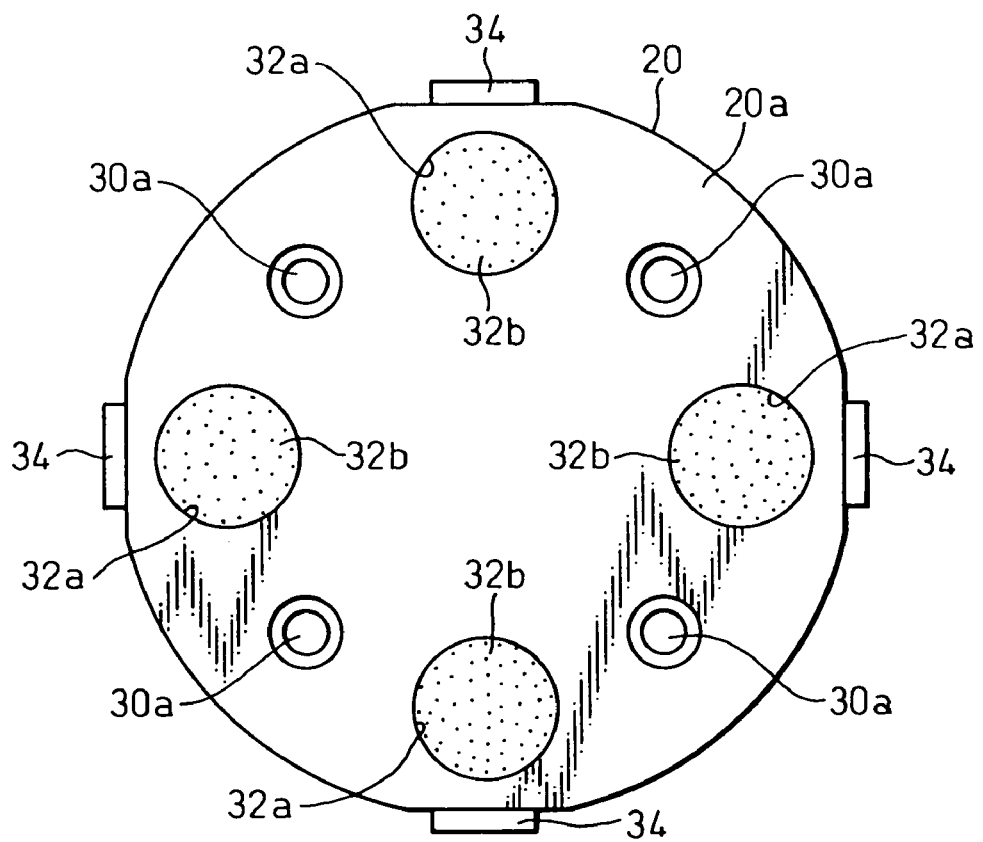

The plate-shaped member 20 mounted to a shaft 19 at the front end of the multiarticulated robot 18 and taking out and conveying the wafer 14 from the cassette 12 is provided with both a lifting means for lifting a wafer stacked in the cassette 12 and a holding means for chucking and holding the wafer 14 lifted by the lifting means at the workpiece chucking surface of the plate-shaped member 20. The plate-shaped member 20 is shown in FIGS. 2A and 2B. This plate-shaped member 20 is formed with openings 30a of the plurality of Bernoulli nozzles 30, 30 . . . serving as the lifting means and chucks 32a of the plurality of vacuum chucking nozzles 32, 32 . . . serving as the holding means at the wafer chucking surface 20a near the outer periphery of the plate-shaped member along the outer periphery of the plate-shaped member 20.

Figure 9A:
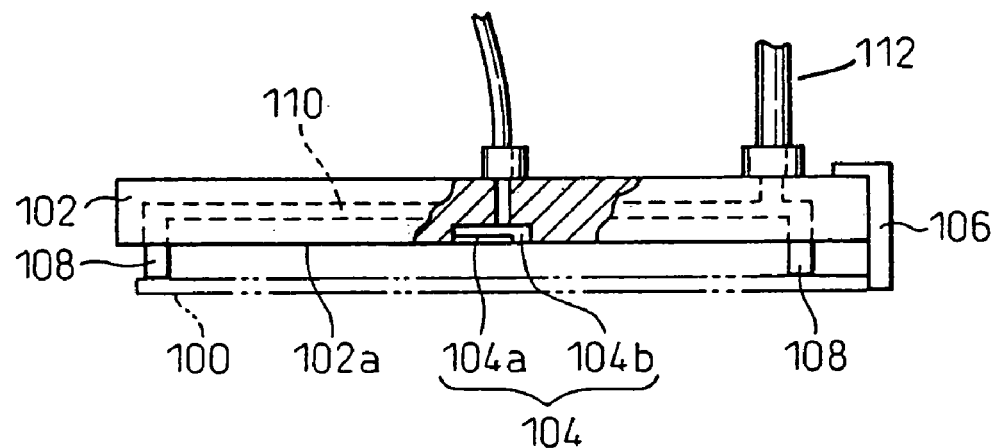
FIGS. 9A and 9B are a partial sectional front view and partial bottom view for explaining a plate-shaped member of the related art.
Figure 9B:
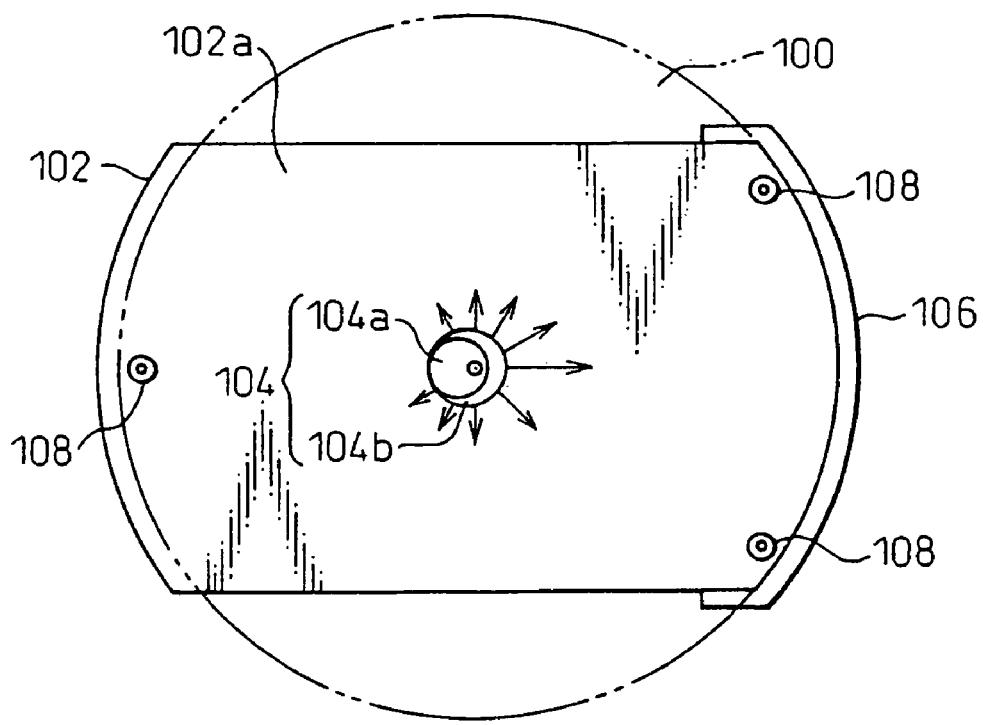

In this way, by forming the openings 30a of the Bernoulli nozzles 30, 30 . . . at the wafer chucking surface 20a near the outer periphery of the plate-shaped member 20, it is possible to evenly lift up the entirety of the wafer 14 by the Bernoulli nozzles 30, 30 . . . Therefore, warping occurring at the wafer 14 lifted can be reduced as much as possible as in the case of lifting the wafer 14 by a Bernoulli nozzle 104 with an opening 104b formed at the center of the plate-shaped member 102 shown in FIGS. 9A and 9B. Therefore, when driving the Bernoulli nozzles 30, 30 . . . to lift a thin wafer of a thickness of less than 100 μm from the cassette 12, it is possible to prevent fracture etc. due to warping of the wafer 14.

Figure 3:
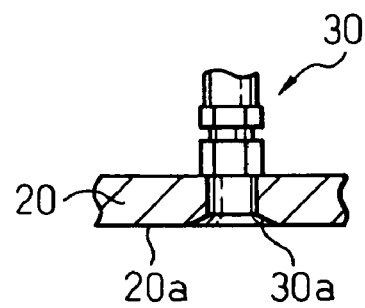
FIG. 3 is a partial sectional view for explaining a Bernoulli nozzle provided at the plate-shaped member of FIGS. 2A and 2B.

A Bernoulli nozzle 30, as shown in FIG. 3, is formed with a tapered opening 30a at the wafer chucking surface 20a of the plate-shaped member 20. A lift based on the so-called "Bernoulli principle" acts on the wafer 14. That is, a conical air flow is blown out from the tapered opening 30a shown in FIG. 3. The outer peripheral air flow blown out along the inclined surface of the opening 30a in the conical air flow becomes higher in speed than the internal air flow blown out from the center of the opening 30a. The internal air flow is pulled to the high speed outer peripheral air flow side, so the conical space (part directly before the opening 30a) becomes a negative pressure and the wafer 14 is lifted. On the other hand, if the wafer 14 is lifted up to block the air flow blown out along the inclined surface of the opening 30a, the negative pressure occurring near the center of the conical air flow is eliminated and the lifted up wafer 14 is lowered. However, if the wafer 14 is lowered, the air flow blown out along the inclined surface of the opening 30a is reproduced, negative pressure is reproduced near the center of the conical air flow, and the wafer 14 is lifted up again. These two contradictory actions balance out, whereby the wafer 14 is lifted up to a predetermined height without abutting against the wafer chucking surface 20a of the plate-shaped member. The wafer 14 lifted up by the Bernoulli nozzles 30, 30 . . . is moved by the air flow along the wafer chucking surface 20a of the plate-shaped member 20 without being affixed to the wafer chucking surface 20a. Therefore, the wafer 14 is kept from detaching from part of the wafer chucking surface 20a of the plate-shaped member 20 by providing plates 34, 34 . . . serving as detachment prevention members at the side wall surfaces of the plate-shaped member 20. Further, according to the Bernoulli nozzles 30, 30 . . . , it is possible to also lift up the interlayer paper between the wafers 14 stacked in the cassette 12 and possible to convey it from the cassette 12 to the container 28.

However, with just the Bernoulli nozzles 30, 30 . . . , the wafer 14 moves without being fixed to the wafer chucking surface 20a of the plate-shaped member 20, so the position of the wafer 14 cannot be recognized at the position measurement area 22 and the wafer 14 cannot be positioned. Therefore, with the plate-shaped member 20 shown in FIGS. 2A and 2B, the chucks 32a of the vacuum chucking nozzles 32, 32 . . . are opened at the wafer chucking surface 20a near the outer periphery of the plate-shaped member 20 along the outer periphery of the plate-shaped member 20. Therefore, a wafer 14 lifted up by the Bernoulli nozzles 30, 30 . . . can be fixed to the wafer chucking surface 20a of the plate-shaped member 10 by the vacuum chucking nozzles 32, 32 . . . , the plate-shaped member 20 can be swiveled based on the positional data of the wafer 14 recognized by the position measurement area 22, and the wafer 13 can be positioned.

Figure 4:
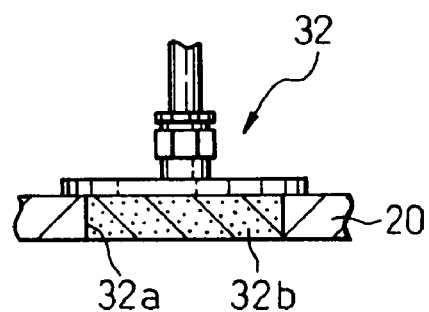
FIG. 4 is a partial sectional view for explaining a vacuum chucking nozzle provided at the plate-shaped member of FIGS. 2A and 2B.

The chuck 32a of the vacuum chucking nozzle 32 of the plate-shaped member shown in FIGS. 2A and 2B is given a porous member 32b serving as a chucking pad as shown in FIG. 4. By using this porous member 32b for the chucking pad, it is possible to chuck the wafer 14 without causing chucking marks. As this porous member 32b, it is possible to use a porous member made for example of a ceramic. Further, the chuck 32a of the vacuum chucking nozzle 32 is formed in the wafer chucking surface 20a of the plate-shaped member 20. The end surfaces of the porous member 32b are attached to the chuck 32a in the same plane as the wafer chucking surface 20a. Therefore, the wafer 14 is brought into close contact with and chucked to the wafer chucking surface 20a of the plate-shaped member 20. In this way, in the plate-shaped member 20 shown in FIGS. 2A and 2B, as in the plate-shaped member 102 shown in FIGS. 9A and 9B having the front ends of the vacuum chucking nozzles 108 projecting out from the surface 102a of the plate-shaped member 102, there is no gap between the workpiece 100 chucked to the front ends of the vacuum chucking nozzles 108 and the surface 102a of the plate-shaped member 102. Therefore, it is possible to reduce to a minimum the warping occurring in the wafer 14 chucked to the wafer chucking surface 20a of the plate-shaped member by the vacuum chucking nozzles 32, 32 . . . and possible to eliminate fracture or other damage occurring due to warping of the wafer 14.

Further, in the plate-shaped member 20 shown in FIGS. 2A and 2B, the openings 30a of the Bernoulli nozzles 30, 30 . . . and the chucks 32a of the vacuum chucking nozzles 32, 32 . . . are alternately formed at the wafer chucking surface 20a near the outer periphery of the plate-shaped member 20. Therefore, it is possible to evenly disperse the openings 30a of the Bernoulli nozzles 30, 30 . . . near the outer periphery of the plate-shaped member 20 and possible to evenly disperse the chucks 32a of the vacuum chucking nozzles 32, 32 . . . As a result, it is possible to more evenly lift the wafer 14 by the Bernoulli nozzles 30, 30 . . . and chuck the entirety of the wafer 14 to the wafer chucking surface 20a by the vacuum chucking nozzles 32, 32 . . . and possible to further prevent fracture and other damage of the wafer 14.

Next, an operational process for moving the wafer 14 by a plate-shaped member 20 attached to a front head of the robot 18 will be explained. As an example, FIG. 8 shows an operational flow chart of the case of moving a wafer 14 from the cassette 12 to the position measurement area 22. At step 1, first the head to which the plate-shaped member 20 is attached is moved to the cassette 12 (FIG. 1). At step 2, next, the head is lowered to the wafer 14 in the cassette 12. At step 3, air starts to be blown out from the Bernoulli nozzles 30. At step 4, the wafer is chucked and the detection sensor is turned on. At step 5, the head is raised. At step 6, the suction by the vacuum chucking nozzles 32 is started. At step 7, air stops being blown from the Bernoulli nozzles 30. At step 8, the vacuum pressure is confirmed. (If vacuum pressure is abnormal, an alarm is turned on.) At step 9, the head is moved to the position measurement area 22. At step 10, the wafer position is measured.

The drive timings of the Bernoulli nozzles 30, 30 . . . and vacuum chucking nozzles 32, 32 . . . provided at the plate-shaped member 20 shown in FIG. 2A are controlled by the controller 36. That is, when lifting the wafer 14 from the cassette 12, the controller 36 emits signals for driving the Bernoulli nozzles 30, 30 . . . and emits signals for stopping the driving of the vacuum chucking nozzles 32, 32 . . . Next, when chucking the wafer 14 lifted by the Bernoulli nozzles 30, 30 . . . by the vacuum chucking nozzles 32, 32 . . . on the wafer chucking surface 20a of the plate-shaped member 20, it emits signals for driving the vacuum chucking nozzles 32, 32 . . . and emits signals for stopping the drive of the Bernoulli nozzles 30, 30 . . . Regarding the timing for switching the operation of the Bernoulli nozzles 30, 30 . . . and vacuum chucking nozzles 32, 32 . . . , if the wafer 14 lifted by the Bernoulli nozzles 30, 30 . . . will not drop, it is possible to stop the operation of the Bernoulli nozzles 30, 30 . . . at the same time as operating the vacuum chucking nozzles 32, 32 . . . , but it is safer to provide a time for operation where the two overlap, then stop the operation of the Bernoulli nozzles 30, 30 . . .

Figure 5:
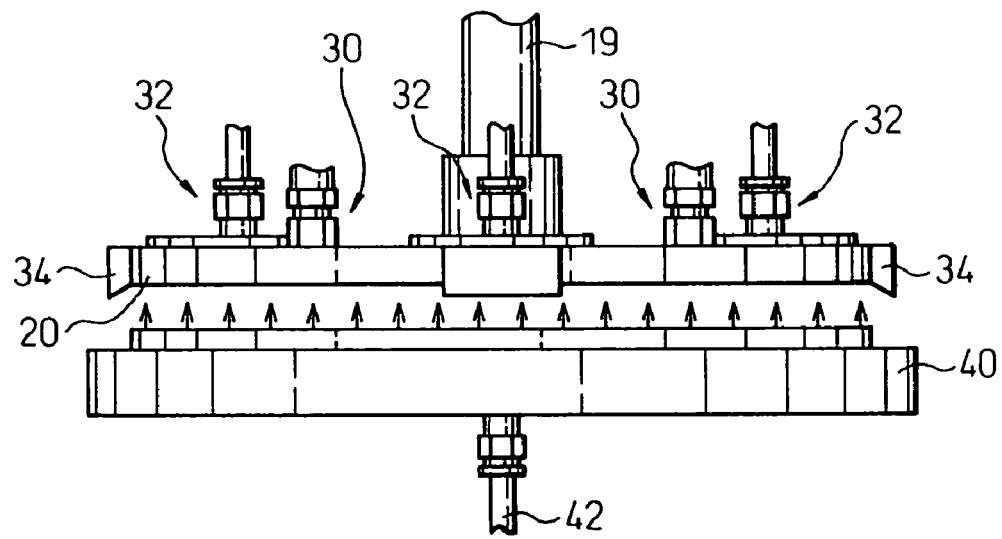
FIG. 5 is a front view for explaining the structure of a switching station shown in FIG. 1.

When switching the operation of the Bernoulli nozzles 30, 30 . . . and the vacuum chucking nozzles 32, 32 . . . , to reliably prevent dropping of the lifted wafer 14, it is preferable to provide a switching station 38 between the cassette 12 shown in FIG. 1 and the position measurement area 22. This switching station 38 is provided with a plate-shaped station part 40 provided with a plurality of pressurized air blowing nozzles for blowing out pressurized air from below the wafer 14 lifted by the Bernoulli nozzles 30, 30 . . . of the plate-shaped member 20 as shown in FIG. 5. This station part 40 is connected with a feed pipe 42 for supplying pressurized air to the plurality of pressurized air blowing nozzles. By switching the operation between the Bernoulli nozzles 30, 30 . . . and the vacuum chucking nozzles 32 32 . . . on the switching station 38, it is possible to reliably prevent dropping of the wafer 14 even with deviation in the timing of switching of operation between the two.

Figure 6:
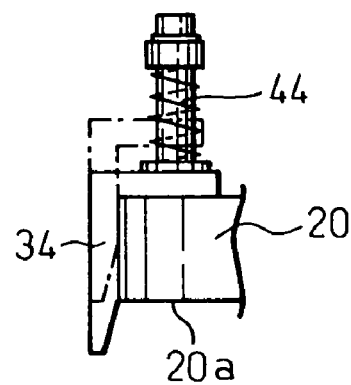
FIG. 6 is a partial front view for explaining another example of a detachment prevention member.

The plates 34, 34 . . . serving as the detachment prevention member provided at the plate-shaped member 20 shown in FIG. 1 to FIG. 5 are affixed to the side wall surfaces of the plate-shaped member 20. Therefore, when stopping the operation of the vacuum chucking nozzles 32, 32 . . . at the adhesion area 24 shown in FIG. 1 and taking out the wafer 14 chucked to the wafer chucking surface 20a by the vacuum chucking nozzles 32, 32 . . . of the plate-shaped member 20d and placing it on the carrying surface, the front ends of the plates 34, 34 . . . abut against the carrying surface of the adhesion area 24 and a predetermined gap is formed between the wafer chucking surface 20a of the plate-shaped member 20 and the carrying surface. Therefore, if stopping the operation of the vacuum chucking nozzles 32, 32 . . . , the wafer 14 descends by a predetermined distance and abuts against the carrying surface. To reduce as much as possible the gap between the wafer chucking surface 20a of the plate-shaped member 20 and the carrying surface of the adhesion area 24, as shown in FIG. 6, it is preferable to use a detachment prevention member biasing the plate 34 by a spring 44 serving as an elastic member in a direction where the front end projects from the wafer chucking surface 20a of the plate-shaped member 20. According to the detachment prevention member shown in FIG. 6, when the front end of the plate 34 abuts against the carrying surface of the adhesion area 24, it is possible to bring the plate-shaped member 20 into proximity with the carrying surface against the biasing force of the spring 44 and possible to reduce as much as possible the gap between the wafer chucking surface 20a and the carrying surface of the adhesion area 24. If it were possible to reduce as much as possible the gap between the wafer chucking surface 20a and the carrying surface of the adhesion area 24, it would be possible to shorten the dropping distance of the wafer 14 and reduce the impact when the wafer 14 strikes the carrying surface of the adhesion area 24.

Figure 7:
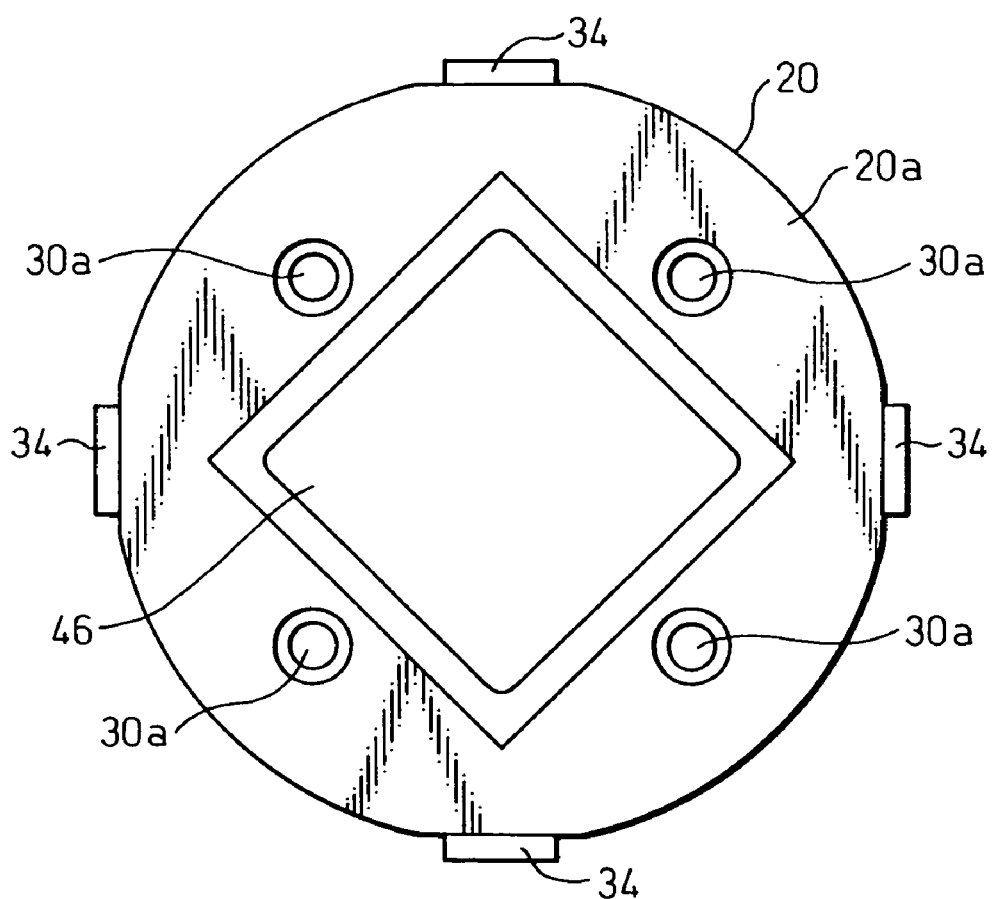
FIG. 7 is a bottom view for explaining another example of the plate-shaped member.

Further, the plate-shaped member 20 shown in FIG. 1 to FIG. 5 uses the vacuum chucking nozzles 32, 32 . . . as the holding means, but when there is no problem with using electrostatic force for the wafer 14, as shown in FIG. 7, it is possible to arrange an electrostatic chucking plate 46 as the holding means at the wafer chucking surface 20a. The electrostatic chucking plate 46 has to evenly chuck the entirety of the wafer 14, so, as shown in FIG. 7, it is also possible to arrange a single electrostatic chucking plate 46 so as to cover the part including the center of the plate-shaped member 20. Instead of the plurality of chucks 32a, 32a. . . shown in FIG. 2B, it is also possible to arrange a plurality of electrostatic chucking plates. In this case as well, the openings 30a of the plurality of Bernoulli nozzles 30, 30 . . . and the plurality of electrostatic chucking plates are alternately provided at the wafer chucking surface 20a near the outer periphery of the plate-shaped member 20 along the outer periphery. In this way, by using the electrostatic chucking plate 46, in the same way as the case of using the vacuum chucking nozzles 32, 32 . . . , it is possible to eliminate the vacuum pump etc. and possible to simplify the conveyor system. According to the present invention, it is possible to safely convey a thin wafer of a thickness of less than 100 μm without damage and possible to easily position the workpiece. Therefore, it is possible to deal with the increasing thinness of workpieces.

While the invention has been described with reference to specific embodiments chosen for purpose of illustration, it should be apparent that numerous modifications could be made thereto by those skilled in the art without departing from the basic concept and scope of the invention.

What is claimed is:

1. A conveyor system for conveying a wafer or other thin workpiece having a thickness of not more than 100 μm from its carrying location to another location, comprising:
   a plate-shaped member provided movably and swivelably and a moving;
   swiveling means for moving and swiveling said plate-shaped member;
   said plate-shaped member being provided together with a lifting means for uniformly lifting in its entirety a workpiece carried at said carrying location and a holding means for holding a workpiece lifted by said lifting means, by uniformly chucking its entirety on a workpiece chucking surface of said plate-shaped member;
   said holding means being comprised of a plurality of vacuum chucking nozzles;
   a plurality of Bernoulli nozzles serving as said lifting means formed in the workpiece chucking surface near an outer periphery of said plate-shaped member along said outer periphery; and
   said plurality of Bernoulli nozzles and said plurality of vacuum chucking nozzles being alternately formed on the workpiece chucking surface near the outer periphery of said plate-shaped member along said outer periphery.

2. A conveyor system as set forth in claim 1, wherein a chucking pad of a vacuum chucking nozzle uses a porous member.

3. A conveyor system for conveying a wafer or other thin workpiece having a thickness of not more than 100 μm from its carrying location to another location, comprising:
   a plate-shaped member provided movably and swivelably;
   moving and swiveling means for moving and swiveling said plate-shaped member;
   said plate-shaped member being provided together with a lifting means for uniformly lifting in its entirety a workpiece carried at said carrying location and a holding means for holding a workpiece lifted by said lifting means, by uniformly chucking its entirety on a workpiece chucking surface of said plate-shaped member;
   said holding means being comprised of at least one electrostatic chucking plate;
   said electrostatic chucking plate being provided at the workpiece chucking surface of said plate-shaped member;
   a plurality of Bernoulli nozzles serving as said lifting means formed in the workpiece chucking surface near an outer periphery of said plate-shaped member along said outer periphery;
   a controller to control drive timings of said lifting means and said holding means; and
   a detachment prevention member to prevent part of the workpiece lifted by the plurality of Bernoulli nozzles from being detached from said plate-shaped member, provided at the outer periphery of the plate-shaped member, and biased by an elastic member in a direction where its front end projects out from the workpiece chucking surface of the plate-shaped member.

4. A conveyor system as set forth in claim 1, further comprising a controller to control drive timings of said lifting means and said holding means.

5. A conveyor system as set forth in claim 1, further comprising a detachment prevention member to prevent part of the workpiece lifted by the plurality of Bernoulli nozzles from being detached from said plate-shaped member, provided at the outer periphery of the plate-shaped member.

6. A conveyor system as set forth in claim 5, wherein said detachment prevention member is biased by an elastic member in a direction where its front end projects out from the workpiece chucking surface of the plate-shaped member.

7. A conveyor system as set forth in claim 1, further comprising a switching station provided with a plurality of pressurized air blowing nozzles blowing pressurized air from below said workpiece so as to prevent said workpiece from dropping off when switching a workpiece lifted by said lifting means comprised of a plurality of Bernoulli nozzles to holding by said holding means.

8. A conveyor system as set forth in claim 3, further comprising a switching station provided with a plurality of pressurized air blowing nozzles to blow pressurized air from below said workpiece so as to prevent said workpiece from dropping off when switching a workpiece lifted by said lifting means comprised of a plurality of Bernoulli nozzles to holding by said holding means.

* * * * *

UNITED STATES PATENT AND TRADEMARK OFFICE
CERTIFICATE OF CORRECTION

PATENT NO. : 7,063,499 B2  Page 1 of 1
APPLICATION NO. : 10/728893
DATED : June 20, 2006
INVENTOR(S) : Akihiro Miyamoto It is certified that error appears in the above-identified patent and that said Letters Patent is hereby corrected as shown below:

Title Pg, Item (57) Abstract: Line 1, change "safety convey" to --safely convey--.

Title Pg, Item (57) Abstract: Line 11, change "Verneuil" to --Beronoulli--.

Column 1, Line 59, change "50" to --so--.

Column 1, Line 65, change "98," to --9B--.

Column 3, Line 44-46, delete "FIG. 3 is a partial sectional view for explaining a Bernoulli nozzle provided at the plate-shaped member of FIGS. 2A and 2B:" and insert the same as a new paragraph on line 50 (Approx.).

Column 7, Line 12, change "32" to --32,--.

Signed and Sealed this

Third Day of April, 2007

JON W. DUDAS
*Director of the United States Patent and Trademark Office*